(12) United States Patent
He et al.

(10) Patent No.: US 11,864,330 B2
(45) Date of Patent: Jan. 2, 2024

(54) THERMALLY ISOLATING MOUNTING BOSS

(71) Applicant: Dell Products L.P., Round Rock, TX (US)

(72) Inventors: Qinghong He, Austin, TX (US); Allen B. McKittrick, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 102 days.

(21) Appl. No.: 17/378,971

(22) Filed: Jul. 19, 2021

(65) Prior Publication Data
US 2023/0015907 A1 Jan. 19, 2023

(51) Int. Cl.
*H05K 5/00* (2006.01)

(52) U.S. Cl.
CPC .................. *H05K 5/0026* (2013.01)

(58) Field of Classification Search
CPC ....................................... H05K 5/006
See application file for complete search history.

(56) References Cited

U.S. PATENT DOCUMENTS

| | | | | |
|---|---|---|---|---|
| 10,496,137 | B1* | 12/2019 | Dickenson | H05K 1/0296 |
| 2005/0048850 | A1* | 3/2005 | Zoller | H05K 5/006 |
| | | | | 439/761 |
| 2013/0343017 | A1* | 12/2013 | Stoehr | H05K 5/006 |
| | | | | 361/752 |
| 2020/0113068 | A1* | 4/2020 | Riedl | H05K 7/142 |

* cited by examiner

*Primary Examiner* — Hung V Ngo
(74) *Attorney, Agent, or Firm* — McDermott Will & Emery LLP

(57) ABSTRACT

A thermally isolating mounting boss for mechanically and electrically coupling a PCB to a chassis while thermally isolating the PCB from the chassis comprises a base section with a base surface coupled to the chassis and an isolation section comprising a plurality of pillars for thermally isolating the PCB from the chassis. A connector maintains the PCB in contact with the plurality of pillars, wherein the connector and the plurality of pillars form grounding circuits. The small cross-section area of each pillar and the cross-section area of the connector have increased thermal resistance to thermally isolate the PCB from the chassis. The pillars may extend from the base section or may be arranged radially outward of the base section.

18 Claims, 9 Drawing Sheets

THERMALLY ISOLATING MOUNTING BOSS

BACKGROUND

Field of the Disclosure

This disclosure relates generally to information handling systems and, more particularly, to thermally insulated mounting bosses.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A printed circuit board (PCB) is typically mounted to a chassis with mounting bosses. Metal mounting bosses provide strong support and a grounding circuit for the PCB.

SUMMARY

Embodiments disclosed herein may be generally directed to portable information handling systems and metal mounting bosses that provide structural support for a mainboard and provide a circuit for grounding the mainboard while reducing the amount of heat conducted through the mounting boss to the chassis.

Embodiments disclosed herein may be directed to thermally insulated mounting bosses for portable information handling system. A thermally isolating mounting boss may comprise a base section having a base surface for coupling to a cover forming part of the chassis and an isolation section comprising a plurality of pillars, each pillar having a board contact surface for contacting a printed circuit board (PCB) and a cross-section area. A combined cross-section area of the plurality of pillars is less than a cross-section area of the base section. The base section may have a a cross-section dimension sized for a central bore. A connector may have a shaft configured for extending through the PCB and engaging the central bore and a cap for contact with a second side of the PCB.

In some embodiments, the plurality of pillars are positioned radially outward of the base section. In some embodiments, the plurality of pillars are formed separately from the base section. In some embodiments, the plurality of pillars extend from the base section. In some embodiments, the plurality of pillars and the base section form a continuous structure. In some embodiments, the isolation section comprises a plurality of pillars connected by a plurality of transverse segments.

In some embodiments, a thermally isolating mounting boss may have a thermal insulator for positioning between the base section and a first side of the PCB, wherein a thickness of the thermal insulator and a height of the base section are approximately equal to a height of the plurality of pillars.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
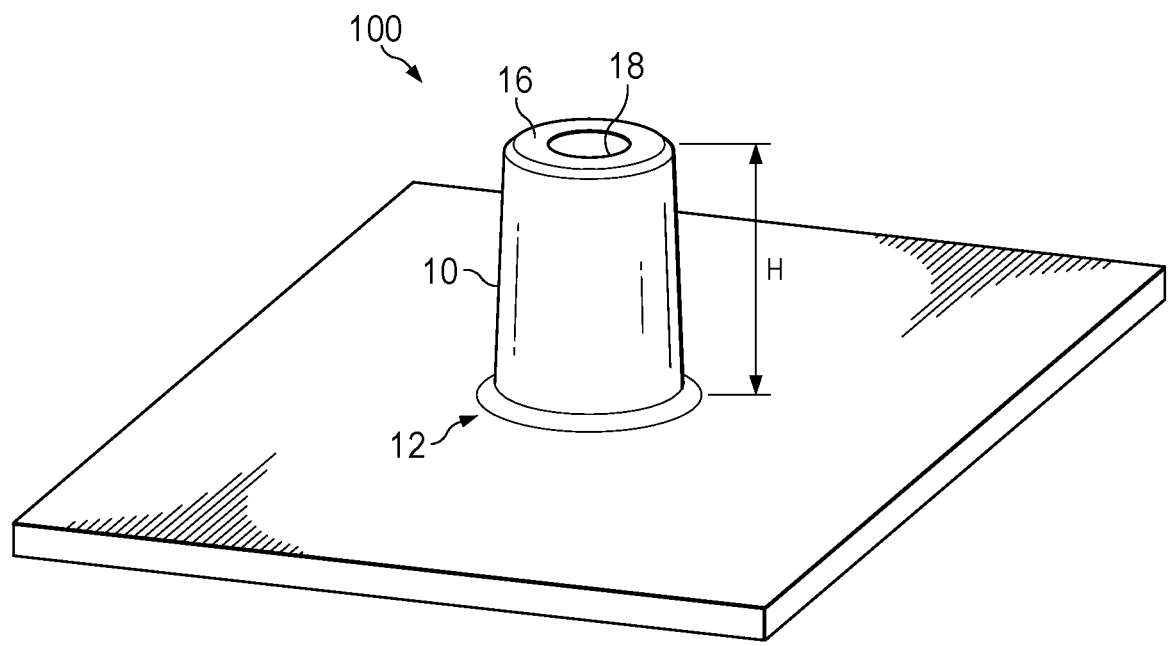
FIG. 1 is a perspective view of a common mounting boss.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, mounting boss "182-1" refers to an instance of a mounting boss, which may be referred to collectively as mounting bosses "182" and any one of which may be referred to generically as mounting boss "182."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Embodiments disclosed herein are described with respect to information handling systems in portable chassis with small overall thicknesses such that conductive heat transfer typically occurs between a printed circuit board (PCB) and a chassis cover but may also be practiced with other chassis. Particular embodiments are best understood by reference to FIGS. 1-13, wherein like numbers are used to indicate like and corresponding parts.

Referring to FIG. 1, a common mounting boss 100 generally has a cylindrical base section 10 with a circular cross-section area and extends a height (H) from a base surface 12 to a board contact surface 16. Base section 10 includes a central bore 18 for receiving a connector (discussed in greater detail below). Central bore 18 may be threaded for receiving threads on the connector.

Figure 2:
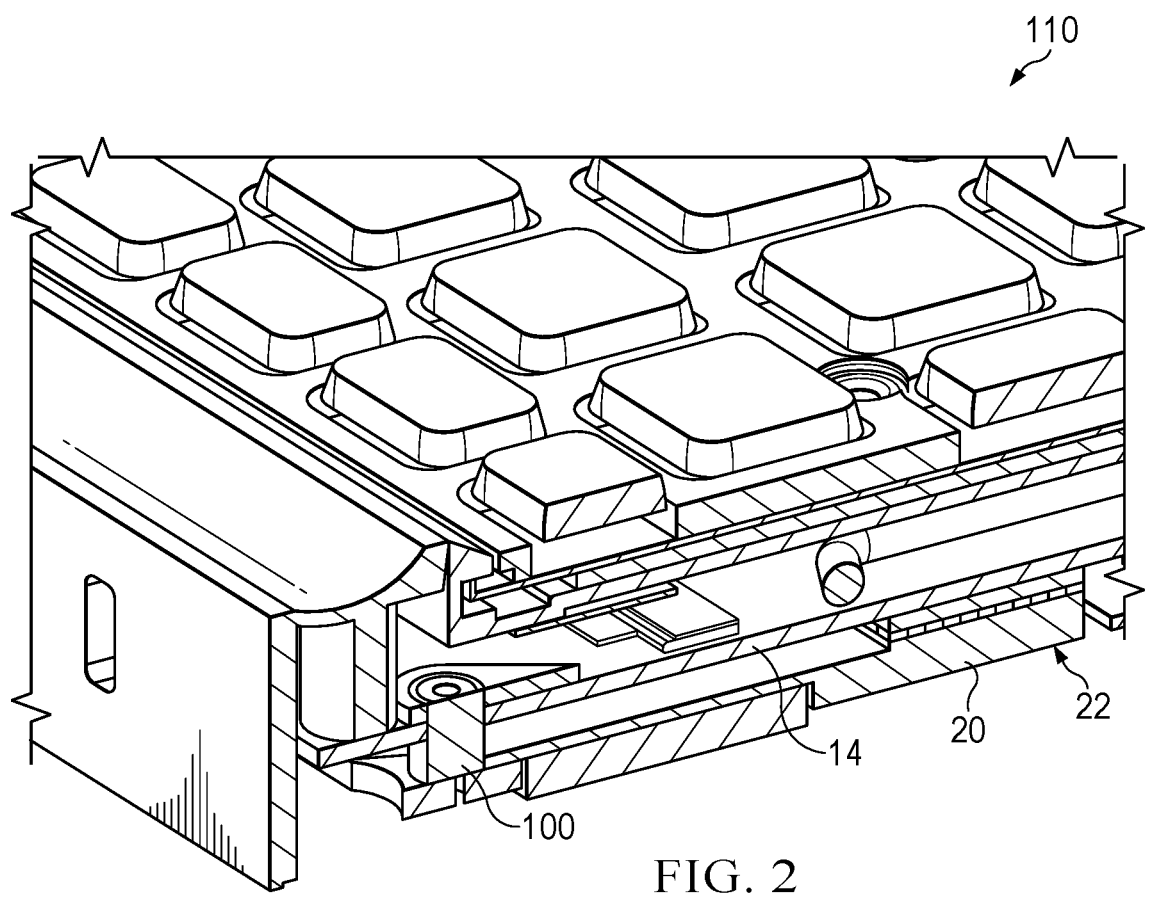
FIG. 2 is a cutaway perspective view of a portable chassis, illustrating positioning of a common mounting boss for supporting a PCB.

Referring to FIGS. 1 and 2, in many portable chassis 20, mounting boss 100 is used to separate a printed circuit board (PCB) 14 from a cover of chassis 20 to reduce the amount of heat that reaches chassis 20. Base surface 12 is configured for contact with a cover or other part of chassis 20 of information handling system 110. Board contact surface 16 is configured for supporting printed circuit board (PCB) 14 such as a mainboard.

Figure 3:
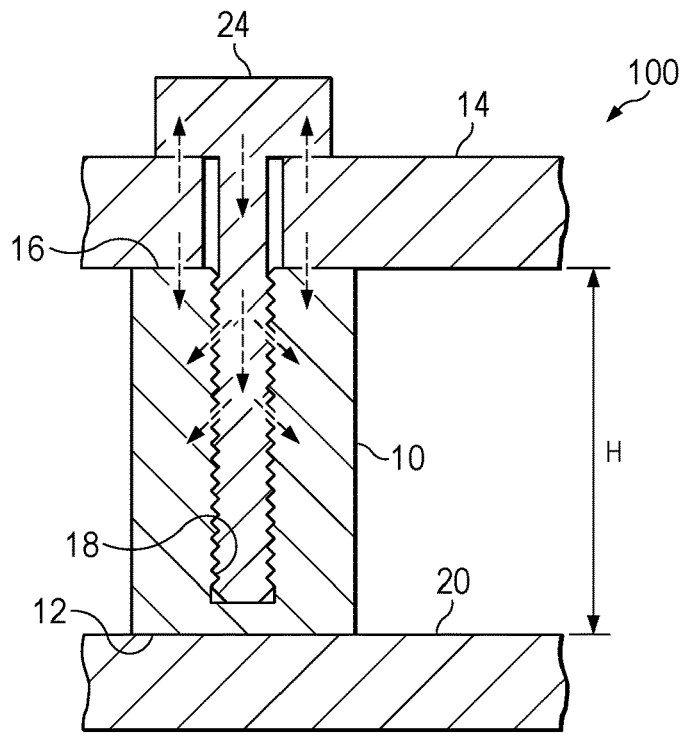
FIG. 3 is a cutaway view of a common mounting boss, illustrating two paths for heat conduction from a PCB to a chassis.

Referring to FIGS. 1-3, during assembly, mounting boss 100 is coupled to chassis 20 and connector 24 is used to secure PCB 14 to mounting boss 100. Connector 24 typically comprises a threaded shaft with a cap. Mounting boss 100 and connector 24 are typically made of conductive metals. Once information handling system 110 is assembled in chassis 20, mounting boss 100 and connector 24 provide a grounding circuit to ensure PCB 14 is electrically grounded to chassis 20.

A problem with this arrangement is that common mounting bosses 100 also provide easy thermal conduction paths (represented by dashed arrows in FIG. 3) whereby heat generated by components on PCB 14 conducts through common mounting bosses 100 and connectors 24 to chassis 20.

The rate at which conductive heat transfer can occur depends on the thermal conduction resistance (R_TH) of mounting boss 100, wherein R_TH=L/KA. L refers to the height (H) of mounting boss 100, A refers to a cross-section area of mounting boss 100 and K refers to a thermal conductivity of the material used to form mounting boss 100. For mounting bosses 100 with high thermal conductivity and large cross-section areas, heat can easily conduct from PCB 14 to chassis 20.

It is noted that mounting boss 100 provides two paths for thermal conduction and electric grounding. A primary path involves PCB 14 directly contacting mounting boss 100 and mounting boss 100 directly contacting chassis 20. For mounting bosses 100 having circular cross-sections, the area is based on the diameter of mounting boss 100.

A secondary thermal conduction path involves PCB 14 contacting connector 24, connector 24 engaging central bore 18 of mounting boss 100 and mounting boss directly contacting chassis 20. For mounting bosses 100 having connector 24 coupled to base section 32, the area may be partially based on the diameter of the shaft of connector 24.

Figure 4:
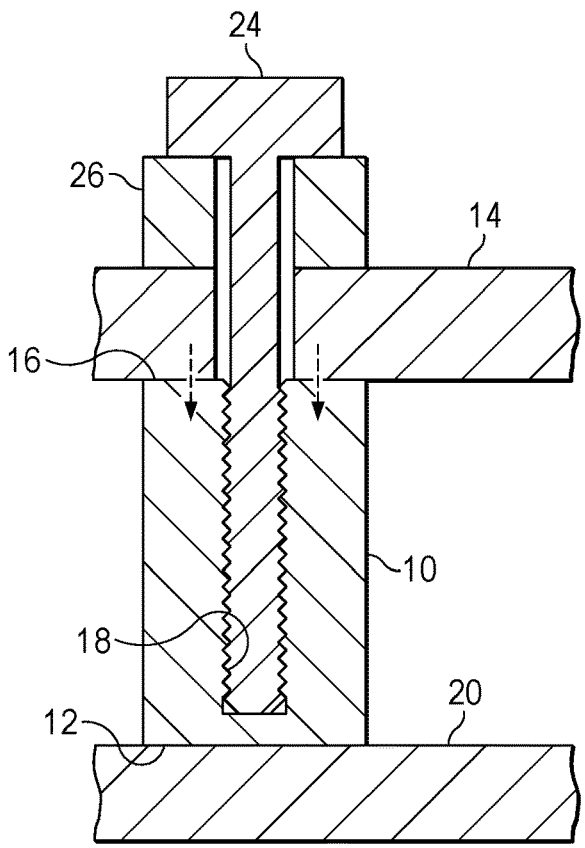
FIG. 4 is a cutaway view of a common mounting boss with a thermal insulator, illustrating a path for heat conduction from a PCB to a chassis.

Referring to FIG. 4, in some existing chassis 20, thermally insulating material 26 such as a plastic washer 26 is added under connector 24 to prevent the secondary heat conduction path but because the main conduction path (i.e., from the PCB 14 through mounting boss 100 to chassis 20) still exists, the improvement is limited. In tests performed on some chassis 20, the improvement was less than 1 degree Centigrade. Thus, the temperature profile as depicted in FIG. 5 may still be representative of the effects of mounting bosses 100 in portable chassis 20.

Another shortcoming of using thermal insulating material 26 is that many thermal insulating materials 26 may also prevent electric grounding. Because mounting boss 100 needs to touch PCB 14 to establish an electrical connection for electromagnetic interference (EMI) requirements, plastic washers 26 cannot be added between mounting boss 100 and PCB 14. Furthermore, thermal insulating material 26 raises the overall height of mounting boss 100 and connector 24, wherein using this arrangement might not be possible due to height limitations of chassis 20. As a result, conductive heat transfer from PCB 14 to chassis 20 is still present.

Figure 5:
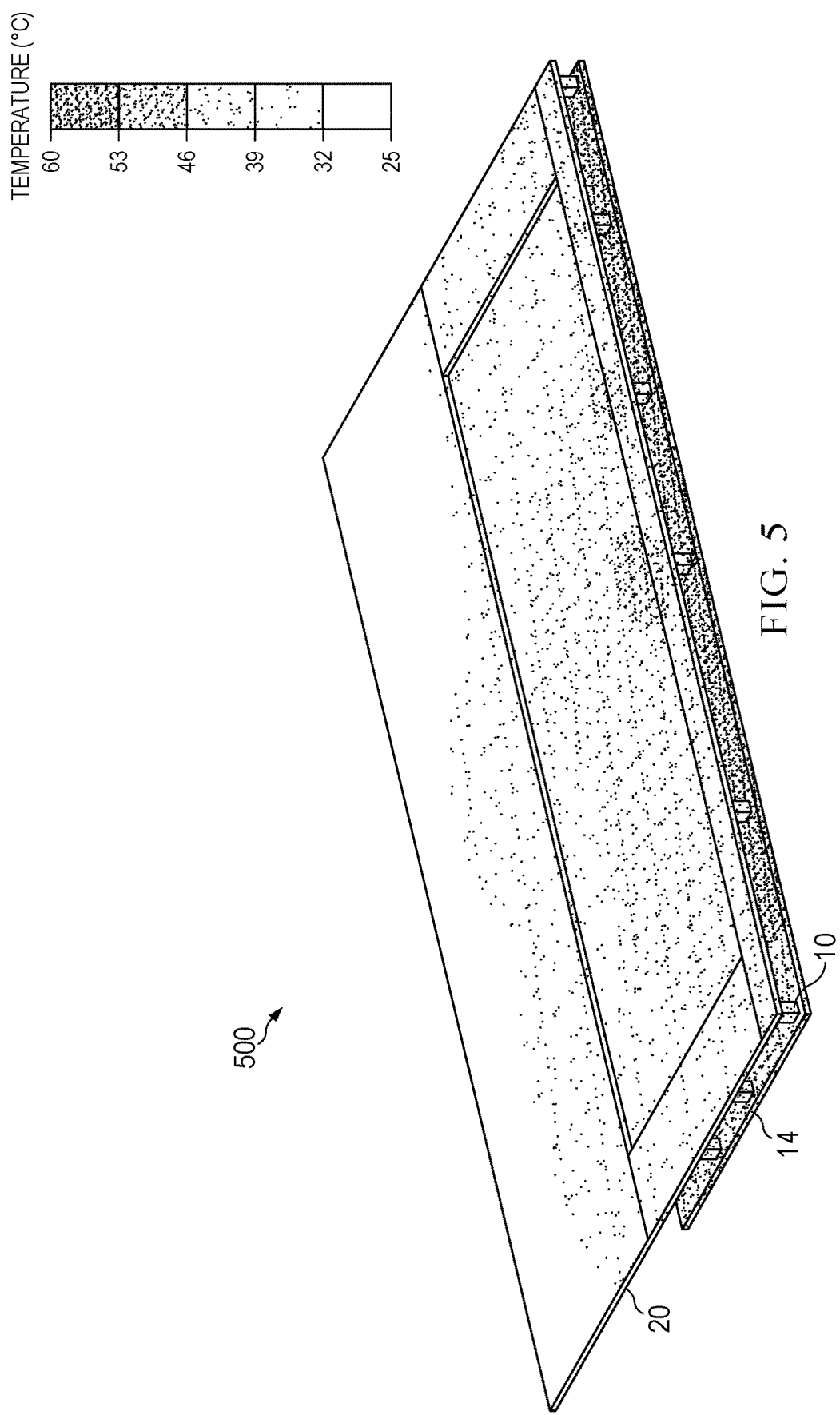
FIG. 5 is an image of a simulated temperature profile for a chassis using a common mounting boss to separate a PCB from a chassis.

Referring to FIG. 5, a simulated temperature profile of chassis 20 illustrates the effect on surface temperature for chassis 20 due to conductive heat transfer from PCB 14 via common mounting bosses 100. Surface temperatures of chassis 20 may reach 46 degrees C. and as high as 48 degrees C.

To improve thermal isolation without affecting grounding, embodiments disclosed herein include thermally isolating mounting bosses configured to maintain electric grounding circuits between PCBs 14 and chassis 20 while thermally isolating PCB 14 from chassis 20.

Isolation Section Has Reduced Contact Surface Areas

As mentioned above, the thermal resistance (R_TH) of a mounting boss may be defined by the equation R_TH=L/KA, in which L refers to height of a mounting boss, A refers to a surface area and K refers to thermal conductivity.

Figure 6:
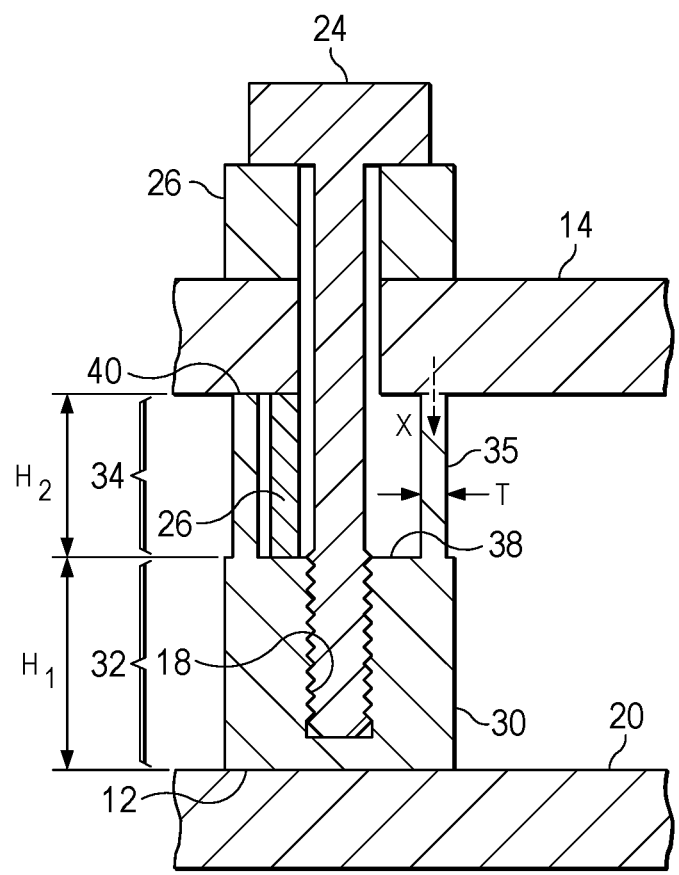
FIG. 6 is a cutaway view of one embodiment of a thermally isolating mounting boss with a thermal insulator.

FIG. 6 depicts one embodiment of a thermally isolating mounting boss 30. Thermally isolating mounting boss 30 comprises base section 32, which may have the same cross-section area as common mounting boss 100 described above. However, thermal isolating mounting boss also comprises an isolation section 34 comprising a plurality of pillars 35 of thickness T, wherein each pillar 35 comprises a small cross-section area and the combined cross-section area of all pillars 35 in isolation section 34 is less than the cross-section area of base section 32, thereby increasing thermal resistance (R_TH).

In some embodiments, base section 32 may be formed with the same cross-section area and formed from a material with the same thermal conductivity as mounting boss 100 described above. In some embodiments, thermally isolating mounting boss 30 may be formed by casting electrically conductive material in a shape similar to mounting boss 100 described above and removing material as needed to form multiple pillars 35 in mounting boss 30. Base section 32 extends from base surface 12 in contact with chassis 20 to a base height (H₁) at base section surface 38. Base section 32 may comprise central bore 18 for receiving connector 24.

Isolation section may be formed radially outward of central bore 18. Isolation section 34 may comprise a plurality of pillars 35 extending from base section surface 38 to PCB contact areas at an isolating section height (H₂). Pillars 35 formed radially outward of central bore 18 may distribute support over a larger area of PCB 14 and allow a standard connector 24 to couple PCB 14 to mounting boss 30.

Electric Conductivity Along Primary Path is Maintained

Still referring to FIG. 6, one or more pillars 35 of isolation section 34 and base section 32 may still define a primary electrical path between PCB 14 and chassis 20. Thermally isolating mounting boss 30 may be formed as a single unit having base section 32 and isolation section 34, wherein material used to form isolation section 34 may be the same material used to form base section 32. Furthermore, thermally isolating mounting boss 30 may be formed from a material with high electric conductivity to ensure PCB 14 is grounded to chassis 20 and the combined heights (H₁ and H₂) of base section 32 and isolation section 34 may equal the height (H) of mounting boss 100 described above. Thermal insulating material 26 may be positioned between PCB 14 and connector 24 to prevent thermal conduction as described above.

Conductive Heat Transfer Reduced Due to Smaller Cross-Section Area of Isolation Section However, due to the reduced cross-section area of each pillar 35 forming isolation section 34, the thermal resistance of thermally isolating mounting boss 30 is increased, thereby thermally isolating PCB 14 from chassis 20. Notably, removing thermal insulating material 26 may not increase heat conduction significantly because the rate at which heat could conduct is limited by the cross-section area of connector 24 over the length of connector 24 from PCB 14 to base section 32.

Figure 7:
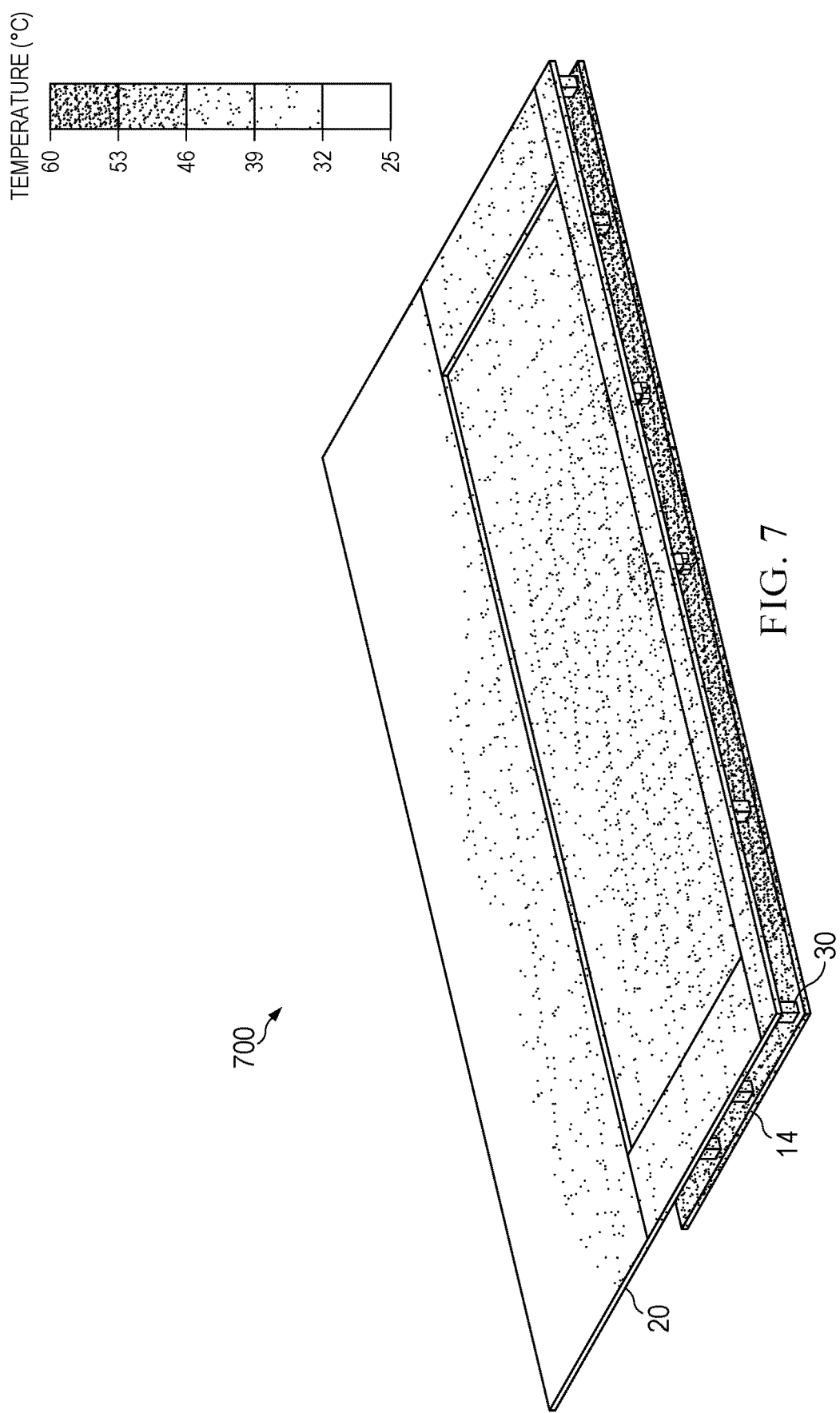
FIG. 7 is an image of a simulated temperature profile for a chassis using one embodiment of a thermally isolating mounting boss to separate a PCB from a chassis.

FIG. 7 depicts a simulated temperature profile for information handling system 110 configured with thermally isolating mounting bosses 30 as depicted in FIG. 6. Even though PCB 14 may be generating the same amount of heat as described above with respect to FIGURE 5, thermally isolating mounting bosses 30 may prevent heat conduction along the primary path and thermally insulating material 26 may prevent heat conduction along the secondary path. Thus, PCB 14 may still reach temperatures closer to 60 C, a surface temperature of chassis 20 may be maintained below 40 C by isolating chassis 20 from PCB 14 using thermally isolating mounting bosses 30.

Figure 8:
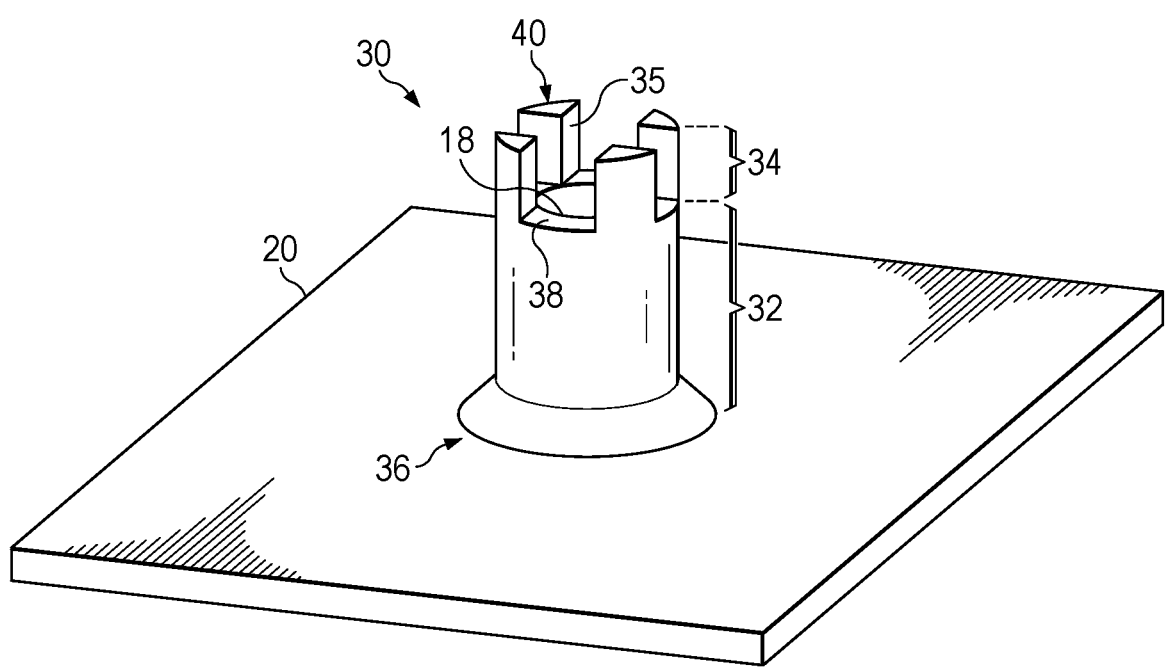
FIGS. 8-12 are perspective views of embodiments of a thermally isolating mounting boss.

Variations of mounting boss 30 are possible. Referring to FIG. 8, embodiments of thermally isolating mounting boss 30 may be formed by machining material from mounting boss 100 described above to form pillars 35 of isolating section 34 and coupling base portion 32 to chassis 20. Base portion 32 may be generally cylindrical with central bore 18 formed therein and isolation section 34 may have multiple pillars 35 (depicted in FIG. 8 as having four pillars 35) for supporting a PCB 14 and allowing electric conductivity but reduced thermal conductivity. Comparing thermally isolating mounting boss 30 with mounting boss 100, the combined cross-section area of all pillars 35 is less than the surface area of the board contact surface 16 of mounting boss 100.

Figure 9:
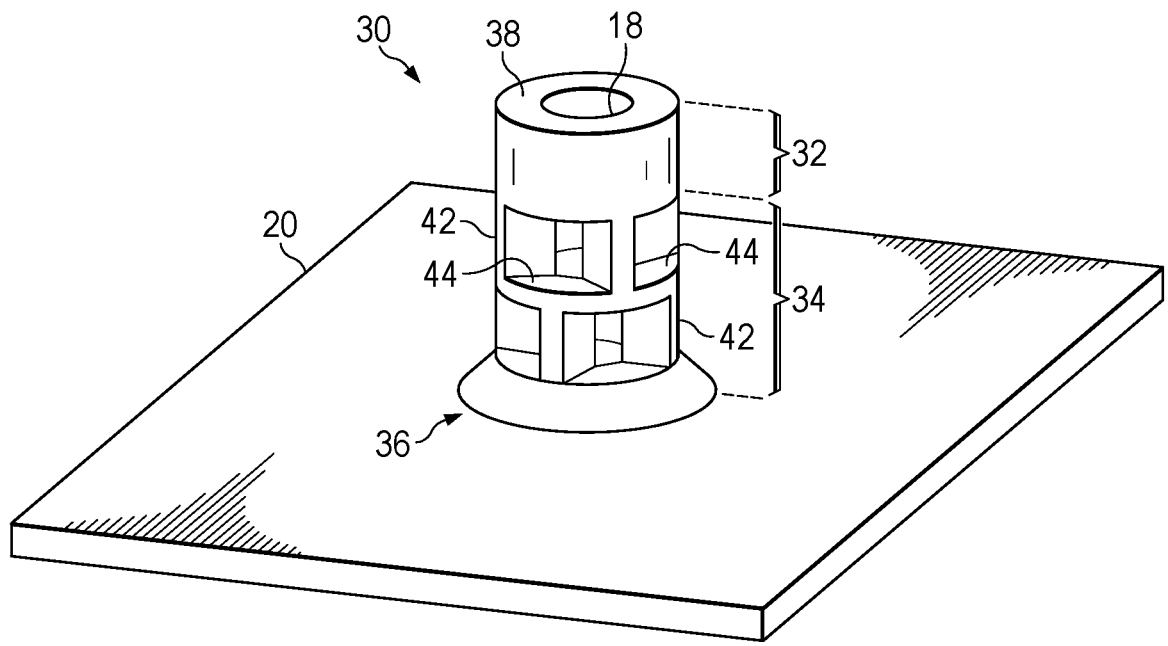
Figure 10:
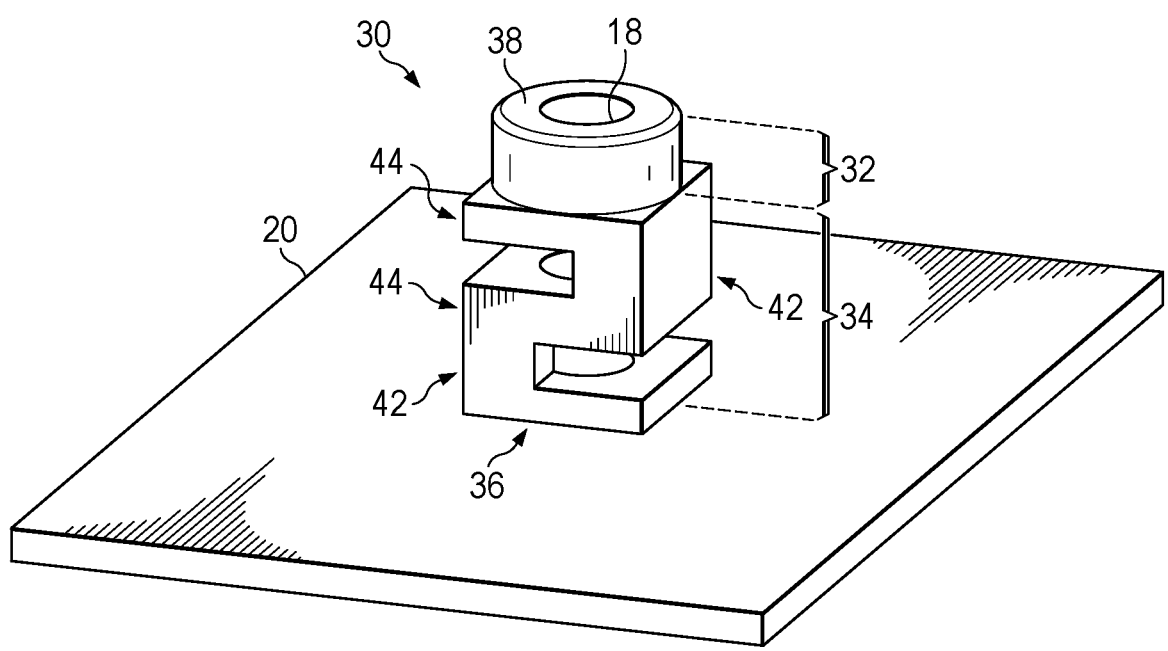

Referring to FIGS. 9 and 10, embodiments of thermally isolating mounting boss 30 may be formed with base section 32 configured for contact with PCB 14 and isolation section 34 closer to chassis 20. Base section 32 may be generally solid with central bore 18 formed therein. Isolation section 34 may be formed with multiple pillars 42 oriented orthogonal to chassis 20 and connected by transverse segments 44. In addition to reducing the cross-section area of pillars 42, thermal paths defined by pillars 42 and transverse segments 44 depicted in FIGS. 9 and 10 may also have increased length, further increasing the thermal resistance of thermally isolating mounting boss 30.

For a short mounting boss, there might not be enough height between PCB 14 and chassis 20 to form mounting bosses 30 as depicted in FIGS. 6 and 8-10. To overcome this issue, FIGS. 11-12 depict embodiments of thermally isolating mounting bosses with pillars 42 arranged radially outward of base section 32 instead of above or below it.

Figure 11:
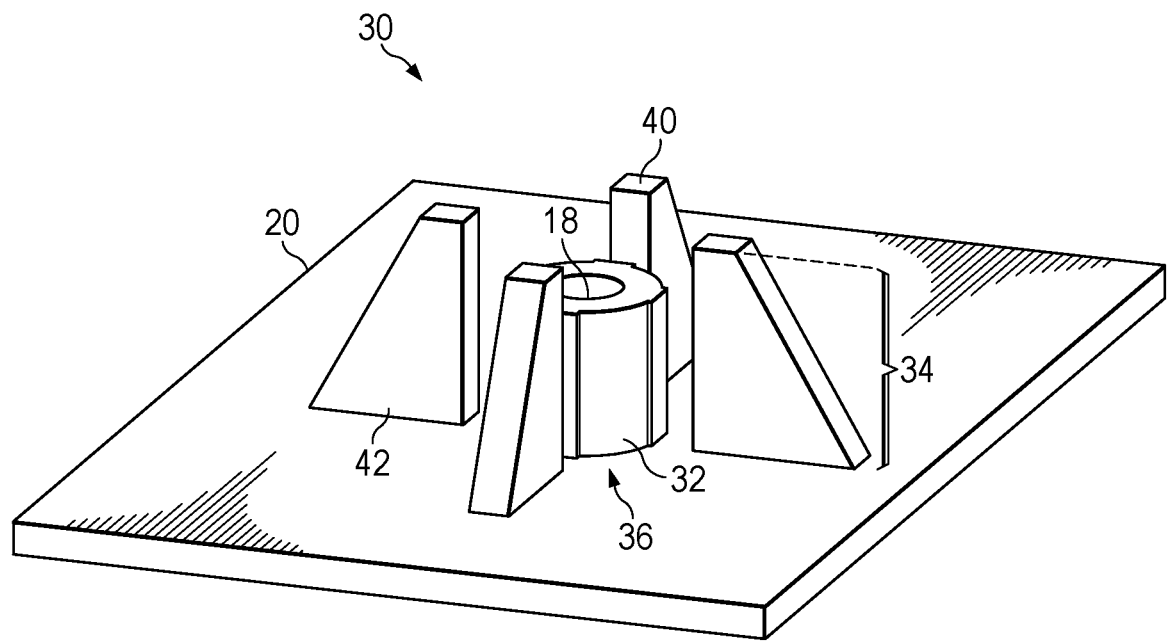

Referring to FIG. 11, thermally isolating mounting boss 30 may be formed with base section 32 comprising central bore 18 as a stand-alone unit and multiple isolation pillars 42 arranged around base section 32. This embodiment could provide better thermal isolation since the thin pillars 42 can be made relatively taller resulting in an even higher thermal resistance (R_TH) and greater reduction in the skin temperature of chassis 20.

Figure 12:
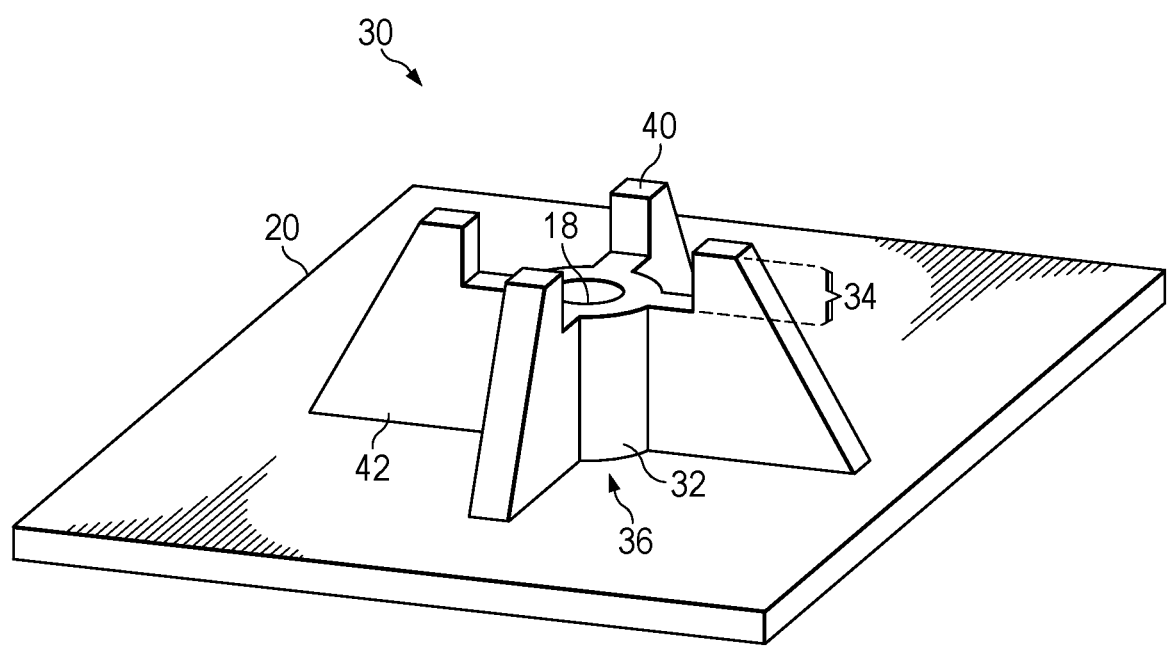

Referring to FIG. 12, thermally isolating mounting boss 30 may be formed with base section 32 comprising central bore 18 and integrated with multiple pillars 42 arranged radially outward of but in contact with base section 32. This embodiment could provide better thermal insulation since thin pillars 42 can be made relatively taller resulting in an even higher thermal resistance (R_TH) and greater reduction in the skin temperature of chassis 20, and may provide more structural support.

Figure 13:
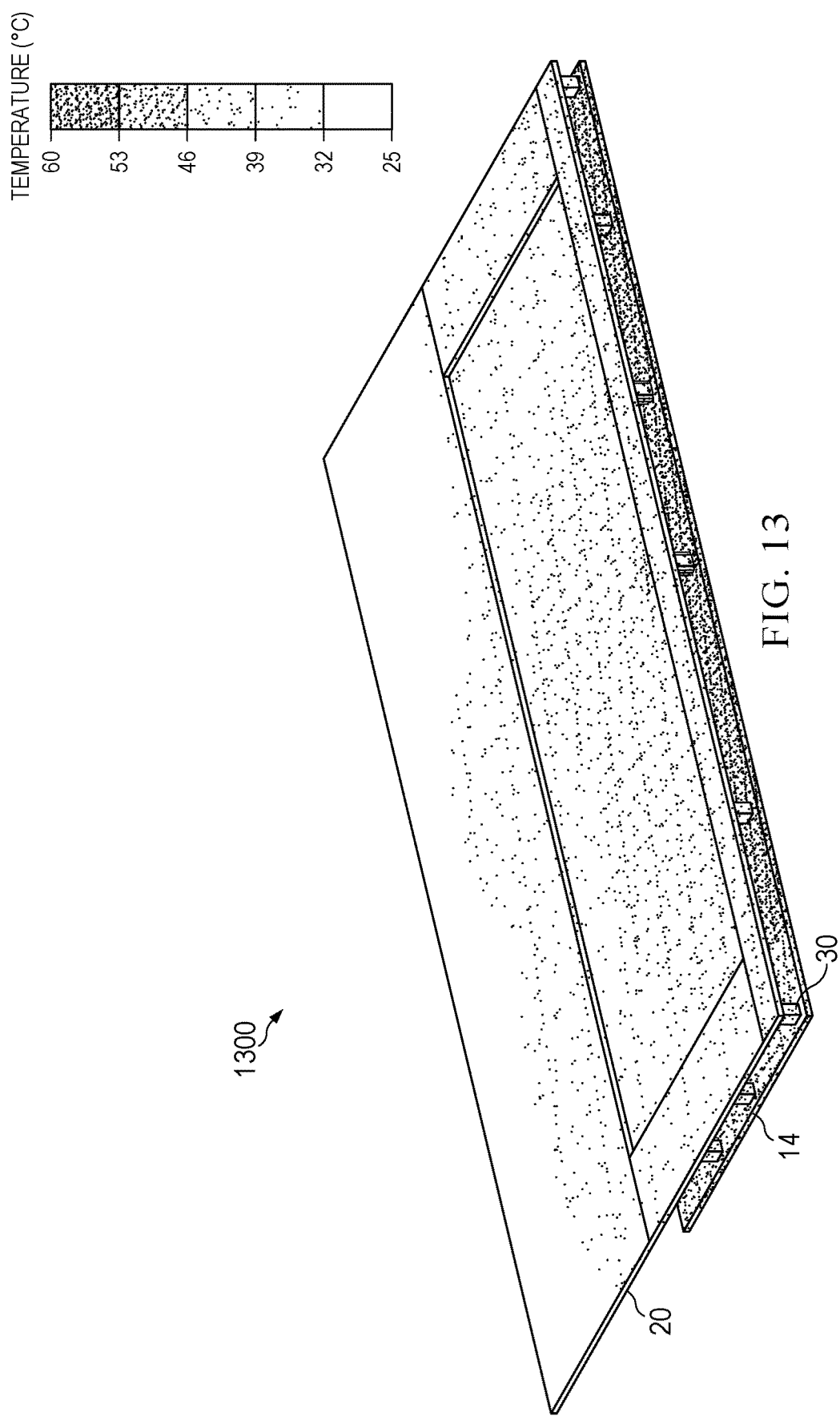
FIG. 13 is an image of a simulated temperature profile for a chassis using one embodiment of a thermally isolating mounting boss with isolating pillars to separate a PCB from a chassis.

FIG. 13 depicts a simulated temperature profile for information handling system 110 configured with embodiments of thermally isolating mounting bosses 30 as depicted in FIG. 12. Even though PCB 14 may be generating the same amount of heat as described above with respect to FIG. 5, thermally isolating mounting bosses 30 may prevent heat conduction along the primary path and thermally insulating material 26 may prevent heat conduction along the secondary path. Thus, PCB 14 may still reach temperatures closer to 60 C, a surface temperature of chassis 20 may be maintained below 40 C by isolating chassis 20 from PCB 14 using thermally isolating mounting bosses 30.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A thermally isolating mounting boss comprising:
   a base section comprising:
     a base surface; and
     a cross-section dimension sized for a central bore;
   an isolation section comprising a plurality of pillars, wherein each pillar has an end with a board contact surface for contacting a first side of a printed circuit board (PCB) and a pillar cross-section area, wherein a combined pillar cross-section area of the plurality of pillars is less than the base section cross-section area;

a thermal insulated material positioned between the base section and the first side of the PCB ; and
a connector comprising:
   a shaft configured for extending through the PCB and engaging the central bore; and
   a cap for contact with a second side of the PCB.

2. The thermally isolating mounting boss of claim 1, wherein the plurality of pillars are positioned radially outward of the base section.

3. The thermally isolating mounting boss of claim 2, wherein the plurality of pillars are formed separately from the base section.

4. The thermally isolating mounting boss of claim 2, further comprising a thermal insulated material positioned between the cap and the second side of the PCB.

5. A thermally isolating mounting boss, comprising:
   a base section comprising:
      a base surface; and
      a cross-section dimension sized for a central bore;
   an isolation section comprising a plurality of pillars extending from the base section and connected by a plurality of transverse segments, wherein each pillar has an end with a board contact surface for contacting a first side of a printed circuit board (PCB) and a pillar cross-section area, wherein the plurality of pillars and the base section form a continuous structure, wherein a combined pillar cross-section area of the plurality of pillars is less than the base section cross-section area; and
   a connector comprising:
      a shaft configured for extending through the PCB and engaging the central bore; and
      a cap for contact with a second side of the PCB.

6. A chassis for an information handling system, the chassis comprising:
   a printed circuit board (PCB);
   a cover; and
   a plurality of thermally isolating mounting bosses for mechanically and electrically coupling the PCB to the cover and thermally isolating the PCB from the cover, each thermally isolating mounting boss comprising:
      a base section comprising:
         a base surface; and
         a cross-section dimension sized for a central bore; and
      an isolation section comprising a plurality of pillars, each pillar having a board contact surface for contacting the PCB, wherein a combined board contact surface area of the plurality of pillars is less than a cross-section area of the base section; and
      a connector configured for extending through the PCB and engaging the central bore.

7. The chassis of claim 6, wherein the plurality of pillars are positioned radially outward of the base section.

8. The chassis of claim 7, wherein the plurality of pillars are formed separately from the base section.

9. The chassis of claim 8, further comprising a thermal insulator for positioning between the base section and a first side of the PCB.

10. The chassis of claim 6, wherein the plurality of pillars extend from the base section.

11. The chassis of claim 10, wherein the plurality of pillars and the base section form a continuous structure.

12. The chassis of claim 11, wherein the isolation section comprises the plurality of pillars connected by a plurality of transverse segments.

13. An information handling system, comprising:
   a chassis comprising a cover;
   a printed circuit board (PCB); and
   a plurality of thermally isolating mounting bosses for mechanically and electrically coupling the PCB to the cover and thermally isolating the PCB from the cover, each thermally isolating mounting boss comprising:
      a base section comprising: a base surface; and
      a cross-section dimension sized for a central bore;
      an isolation section comprising a plurality of pillars, each pillar having a board contact surface for contacting the PCB, wherein a combined board contact surface area of the plurality of pillars is less than a cross-section area of the base section; and
      a connector configured for extending through the PCB and engaging the central bore.

14. The information handling system of claim 13, wherein the plurality of pillars are positioned radially outward of the base section.

15. The information handling system of claim 14, wherein the plurality of pillars are formed separately from the base section.

16. The information handling system of claim 15, further comprising a thermal insulator for positioning between the base section and a first side of the PCB.

17. The information handling system of claim 13, wherein the plurality of pillars extend from the base section.

18. The information handling system of claim 17, wherein the isolation section comprises the plurality of pillars connected by a plurality of transverse segments.

* * * * *